(12) United States Patent
Sakai

(10) Patent No.: US 8,222,054 B2
(45) Date of Patent: Jul. 17, 2012

(54) LED LIGHT SOURCE AND CHROMATICITY ADJUSTMENT METHOD FOR LED LIGHT SOURCE

(75) Inventor: Keisuke Sakai, Matsudo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 502 days.

(21) Appl. No.: 12/429,836

(22) Filed: Apr. 24, 2009

(65) Prior Publication Data

US 2009/0267099 A1    Oct. 29, 2009

(30) Foreign Application Priority Data

Apr. 24, 2008 (JP) ................................. 2008-113546
Oct. 22, 2008 (JP) ................................. 2008-272248

(51) Int. Cl.
*H01L 21/00* (2006.01)

(52) U.S. Cl. ................. 438/22; 438/25; 438/26; 438/29; 257/98

(58) Field of Classification Search .................. 257/98; 438/22, 25, 26, 29
See application file for complete search history.

(56) References Cited

U.S. PATENT DOCUMENTS

| | | | | |
|---|---|---|---|---|
| 7,261,837 B2 * | 8/2007 | Debray et al. | ........... | 252/301.36 |
| 2008/0042150 A1 * | 2/2008 | Yamaguchi | ...................... | 257/88 |
| 2010/0252843 A1 * | 10/2010 | Ohashi et al. | ................... | 257/91 |

FOREIGN PATENT DOCUMENTS

JP    2004-186488    7/2004

OTHER PUBLICATIONS

Machine Translation of JP 2004-186488.*

* cited by examiner

*Primary Examiner* — Anthony Ho
(74) *Attorney, Agent, or Firm* — Finnegan, Henderson, Farabow, Garrett & Dunner, L.L.P.

(57) ABSTRACT

There is provided an LED light source whose chromaticity can be adjusted easily without changing its outer shape and suffering damage in the process of chromaticity adjustment. An LED light source includes an LED device, a fluorescent material that absorbs and wavelength-converts a portion of light emitted from the LED device to emit light from itself, a sealing material that includes the fluorescent material and that is disposed around the LED device, and light scattering sections that are formed at a portion of a surface of the sealing material and scatter a portion of the light emitted from the LED device for adjusting chromaticity of the LED light source, and a chromaticity adjustment method for such LED light source.

15 Claims, 17 Drawing Sheets

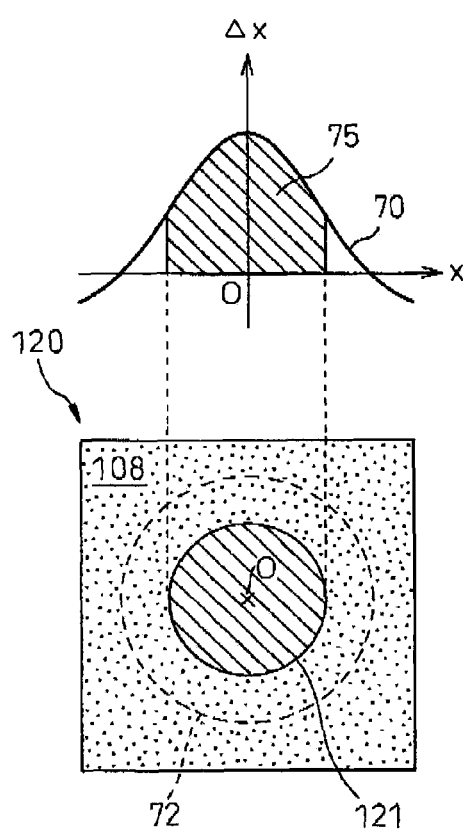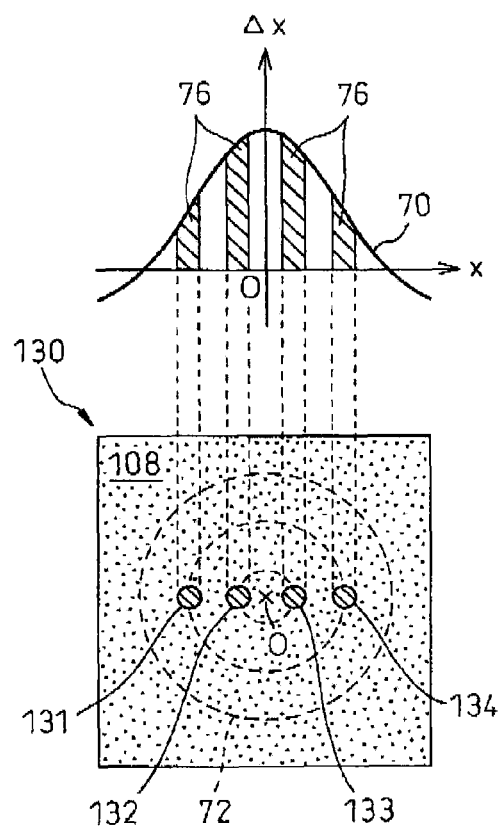

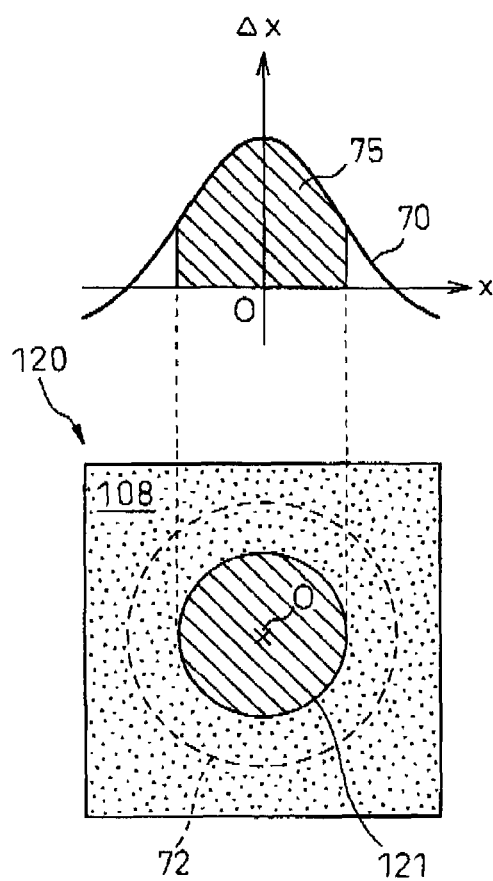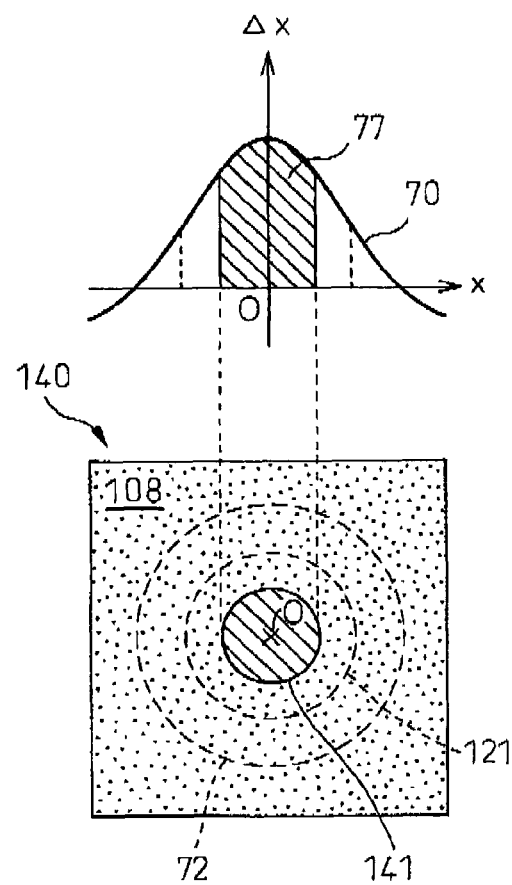

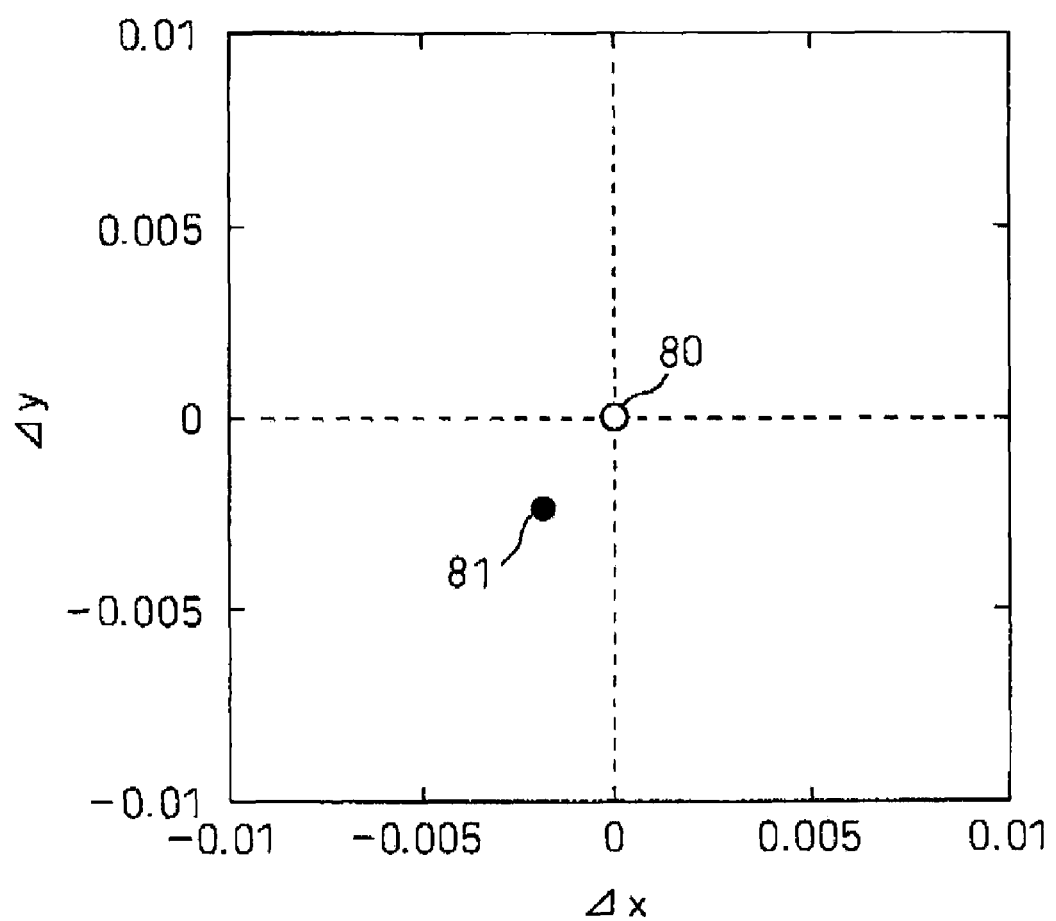

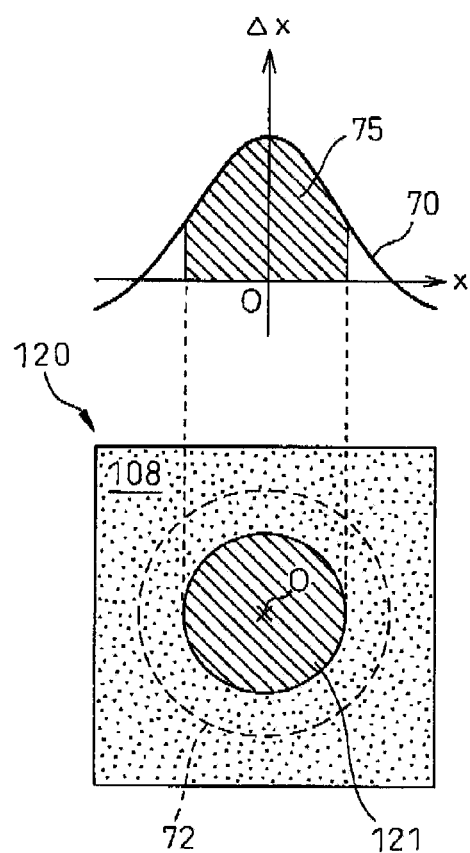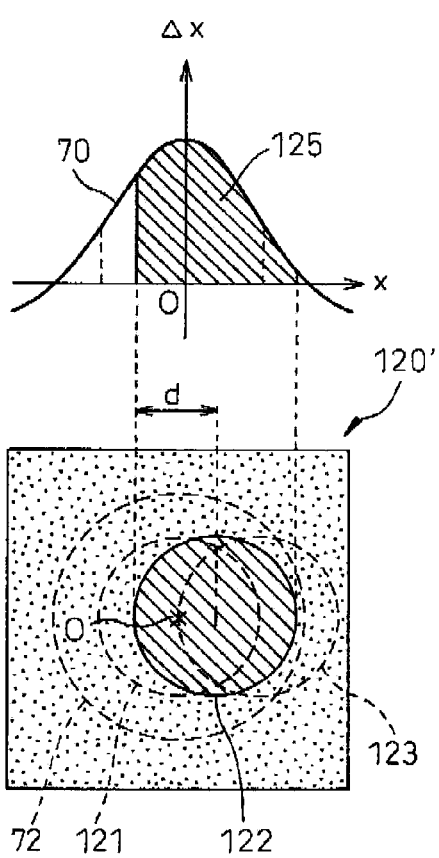

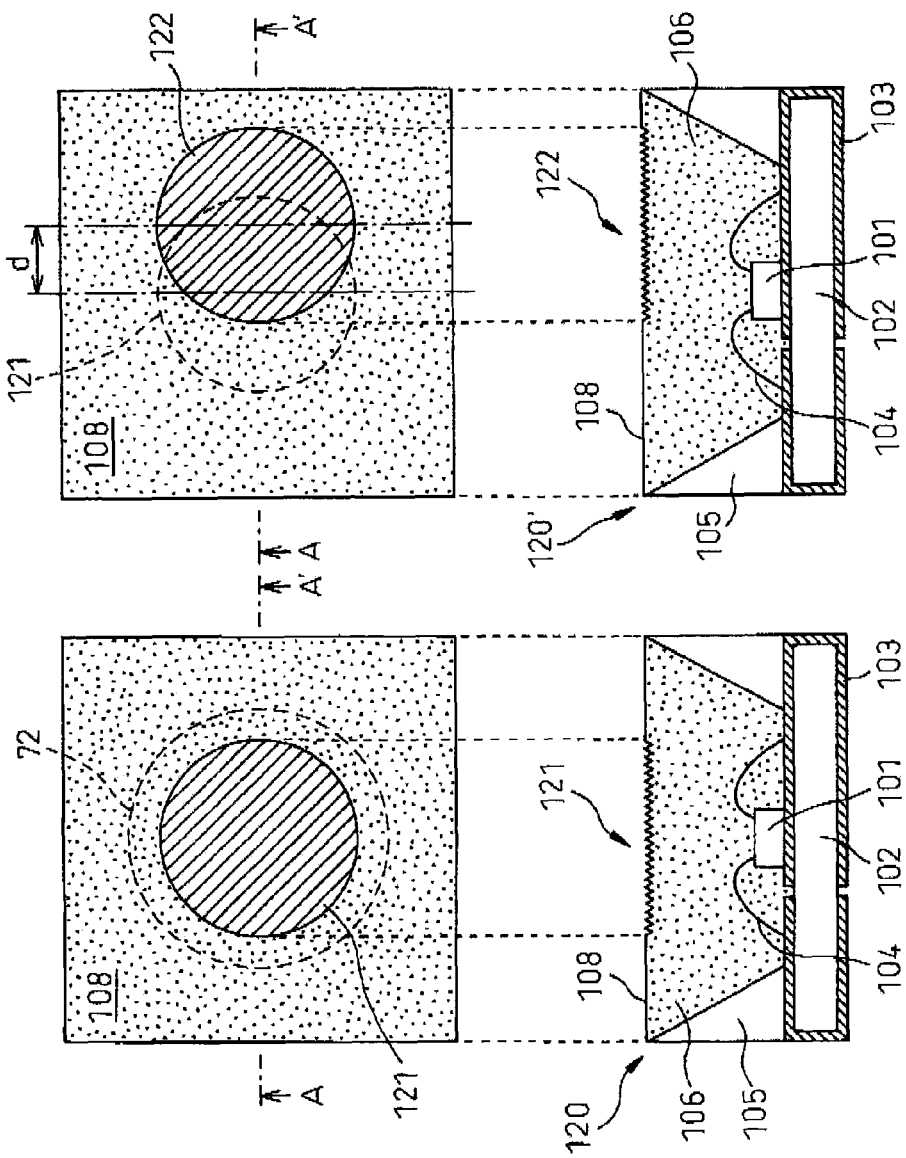

LED LIGHT SOURCE AND CHROMATICITY ADJUSTMENT METHOD FOR LED LIGHT SOURCE

This application is a new U.S. patent application that claims benefit of JP 2008-272248, filed Oct. 22, 2008, the content of 2008-272248 is incorporated herein by reference.

FIELD OF THE INVENTION

The present invention relates to an LED light source and a chromaticity adjustment method for the LED light source, and in particular, it relates to an LED light source in which a portion of light emitted from an LED is wavelength-converted by a fluorescent material and a chromaticity adjustment method for such LED light source.

BACKGROUND OF THE INVENTION

In recent years, various LED light source products have been developed with improved brightness and other characteristics. In particular, white LED light sources that can be realized by development of blue LED devices have advantages common to LED light sources, such as low power consumption and long life, and therefore receive attention as new illumination light sources that can replace fluorescent and incandescent lamps that are used for general illumination and interior lighting at present.

FIG. 18 is a cross-sectional view of an LED light source 10.

In LED light source 10, an LED device 101 is disposed on a substrate. In the substrate, a pattern of a wiring conductor 103 for supplying electric power to the LED is formed on a base material 102. Further, LED device 101 is mounted on the substrate by using die bonding paste, Ag paste and the like. Further, LED device 101 is supplied with electric power from the outside via wiring conductor 103 on the substrate and bonding wires 104 and emits light.

Around LED device 101, a sealing material 106 is formed for protecting LED device 101. Further, a first fluorescent material is mixed in resin of sealing material 106. The fluorescent material absorbs and wavelength-converts a portion of the light emitted from LED device 101 to emit light from itself. Further, a reflective frame 105 is disposed outside sealing material 106.

In LED light source 10, a nitride compound semiconductor emitting blue light is used as LED device 101, while an yttrium-aluminum-garnet (YAG) fluorescent material activated with cerium is used as the first fluorescent material. As a result, white LED light source 10 emits pseudo white light in which the blue light from LED device 101 and the yellow light from the first fluorescent material are mixed together.

LED light source 10 in which LED device 101 and the first fluorescent material are combined to emit the pseudo white light has a disadvantage in that chromaticity varies between individual LED light sources unless a ratio between the blue light and the yellow light is constant.

It is thought that chromaticity variation between individual LED light sources 10 occurs due to unevenness in the amount of the sealing material, dispersion condition and particle size of the fluorescent material, and the like.

FIG. 19 is a diagram illustrating an example of chromaticity coordinates.

For example, as the amount of fluorescent material in sealing material 106 increases, the chromaticity of LED light source 10 is shifted from the white region toward the yellow side on the chromaticity coordinates and as the amount of fluorescent material in sealing material 106 decreases, the chromaticity of LED light source 10 is shifted from the white region toward the blue side on the chromaticity coordinates. It is difficult to avoid such variation of the chromaticity between the individual LED light sources in the manufacturing process, and therefore it is very difficult to mass-produce LED light sources having a constant chromaticity only.

Patent Document 1 describes a method for adjusting chromaticity by changing a thickness of an upper part of a transparent resin layer after hardening by polishing, coating and the like so as to change light paths from an LED device.

FIG. 20 is diagram describing the chromaticity adjustment method as set forth in Patent Document 1.

In LED light source 20, an LED device 101 is disposed on a substrate comprised of base material 102 and wiring conductor 103 and it is electrically connected with wiring conductor 103 via bonding wires 104. A sealing material is filled inside reflective frame 105 disposed on the substrate. At the lower part of the sealing material, a first fluorescent material 21 is deposited and, at the upper part of the sealing material, only a transparent resin 22 is hardened.

FIG. 20(a) illustrates an example in which transparent resin 22 at the upper part is polished till a target chromaticity is obtained. In the example of FIG. 20(a), transparent resin 22 is polished until the resin surface is lowered from position 23 before polishing to position 24 after polishing. As a result, the light is confined in a narrower space (of the transparent resin) and its reflection is repeated more frequently, so that the probability that the light from LED device 101 encounters the first fluorescent material increases, and thus the wavelength-conversion rate also increases. Therefore, the chromaticity of LED light source 20 is adjusted from blue to yellow.

FIG. 20(b) illustrates an example in which further resin is added above position 23 of the resin surface so as to raise the resin surface to position 25. In the example of FIG. 20(b), as the amount of resin increases, the light passes through a larger space (of the transparent resin), so that the probability of light from LED device 101 encountering the first fluorescent material decreases, and thus the wavelength-conversion rate also decreases. Therefore, the chromaticity of LED light source 30 is adjusted from yellow to blue.

Thus, it is possible to adjust the chromaticity by simply increasing or decreasing the amount of the transparent resin. However, if there is any restriction on an outer shape of the LED light source, it is difficult to increase or decrease the amount of the transparent resin. Further, when the transparent resin is polished, the LED light source may be impacted, scratched or otherwise damaged, so that malfunctions may occur such as, for example, breakage of the bonding wires, damage of the reflective frame and the like.

Patent Document 1: JP-A-2004-186488 (page 4, page 8 and FIG. 2)

SUMMARY OF THE INVENTION

Therefore, it is an object of the present invention to provide an LED light source and a chromaticity adjustment method for the LED light source that can solve the above problems.

Further, it is another object of the present invention to provide an LED light source that hardly changes its outer shape and is hardly damaged in the process of chromaticity adjustment and whose chromaticity can be adjusted easily, and a chromaticity adjustment method for such LED light source.

According to the present invention, an LED light source includes an LED device, a fluorescent material that absorbs and wavelength-converts a portion of light emitted from the LED device to emit light from itself, a sealing material that includes the fluorescent material and that is disposed around the LED device, and light scattering sections that are provided at a portion of a surface of the sealing material and scatter a portion of the light emitted from the LED device for adjusting chromaticity of the LED light source.

According to the present invention, a chromaticity adjustment method in an LED light source having an LED device, a fluorescent material that absorbs and wavelength-converts a portion of light emitted from the LED device to emit light from itself, and a sealing material that includes the fluorescent material and that is disposed around the LED device, includes the step of forming light scattering sections on a surface of the sealing material that scatter a portion of light emitted from the LED device for adjusting chromaticity of the LED light source.

According to the present invention, a chromaticity adjustment method in an LED light source having an LED device, a fluorescent material that absorbs and wavelength-converts a portion of light emitted from the LED device to emit light from itself, and a sealing material that includes the fluorescent material and that is disposed around the LED device, includes the steps of measuring chromaticity of the LED light source, and forming light scattering sections on a surface of the sealing material that scatter a portion of light emitted from the LED device according to chromaticity correction amount for adjusting the measured chromaticity to the desired chromaticity of the LED light source.

According to the present invention, a chromaticity adjustment method in an LED light source having an LED device, a fluorescent material that absorbs and wavelength-converts a portion of light emitted from the LED device to emit light from itself, and a sealing material that includes the fluorescent material and that is disposed around the LED device, includes the steps of measuring chromaticity of the LED light source, determining positions of light scattering sections according to chromaticity correction amount for adjusting the measured chromaticity to the desired chromaticity, and forming the light scattering sections on a surface of the sealing material that scatter a portion of light emitted from said LED device according to the determined positions.

According to the present invention, a chromaticity adjustment method in an LED light source having an LED device, a fluorescent material that absorbs and wavelength-converts a portion of light emitted from the LED device to emit light from itself, and a sealing material that includes the fluorescent material and that is disposed around the LED device, includes the step of forming light scattering sections that scatter a portion of light emitted from the LED device for adjusting chromaticity while displacing their positions on a surface of the sealing material according to the chromaticity adjustment of the LED light source.

In the LED light source and the chromaticity adjustment method for the LED light source according to the present invention, preferably, the light scattering sections include projections and depressions formed as dots, projections and depressions formed in the form of lines, or projections and depressions formed in the form of planes.

In the LED light source and the chromaticity adjustment method for the LED light source according to the present invention, preferably, the LED device emits blue light and the fluorescent material absorbs the blue light and emits yellow light so that the LED light source emits pseudo white light, wherein the light scattering sections are provided in a region within a critical angle so as to adjust chromaticity of the pseudo white light emitted from the LED light source toward the yellow side.

In the LED light source and the chromaticity adjustment method for the LED light source according to the present invention, preferably, the LED device emits blue light and the fluorescent material absorbs the blue light and emits yellow light so that the LED light source can emit pseudo white light, wherein the light scattering sections are provided outside a region within a critical angle so as to adjust chromaticity of the pseudo white light emitted from the LED light source toward the blue side.

According to the present invention, by forming light scattering sections on a surface of a sealing material, it is possible to provide an LED light source whose chromaticity can be adjusted easily without changing its outer shape and suffering damage in the process of chromaticity adjustment.

DESCRIPTION OF THE DRAWINGS

These and other features and advantages of the present invention will be better understood by reading the following detailed description, taken together with the drawings wherein:

FIG. 7(a) is a diagram illustrating a top view of another LED light source 120 as well as its distribution of chromaticity correction, and, similarly, FIG. 7(b) is a diagram illustrating a top view of yet another LED light source 130 as well as its distribution of chromaticity correction;

FIG. 8(a) is a diagram similar to FIG. 7(a), and FIG. 8(b) is a diagram illustrating a top view of still another LED light source 140 as well as its distribution of chromaticity correction;

FIG. 11 is a diagram illustrating other exemplary chromaticity coordinates;

FIG. 13(a) is a diagram similar to FIG. 7(a), and FIG. 13(b) is a diagram illustrating an LED light source 120' in which a light scattering section 121 in FIG. 13(a) is displaced rightward in the figure by a distance d and designated as a light scattering section 122;

FIG. 14(a) is a top view corresponding to FIG. 13(a) as well as its cross-sectional view taken along line A-A', and FIG. 14(b) is a top view corresponding to FIG. 13(b) as well as its cross-sectional view taken along line A-A';

DETAILED DESCRIPTION OF THE PREFERRED EMBODIMENT

Hereinafter, an LED light source and a chromaticity adjustment method for the LED light source according to the present invention will be described with reference to the drawings. It should, however, be noted that the technical scope of the present invention is not limited to the specific embodiments described herein, but extends to the inventions described in the appended claims as their equivalents.

FIG. 1 is diagram illustrating an LED light source according to the present invention.

Figure 1A:
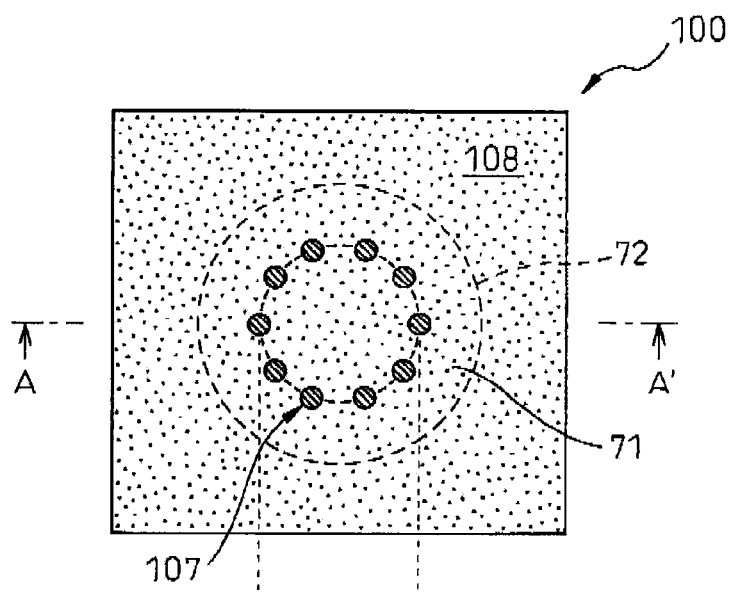
FIG. 1(a) is a top view of an LED light source and FIG. 1(b) is a cross-sectional view taken along line A-A' in FIG. 1(a)
Figure 1B:
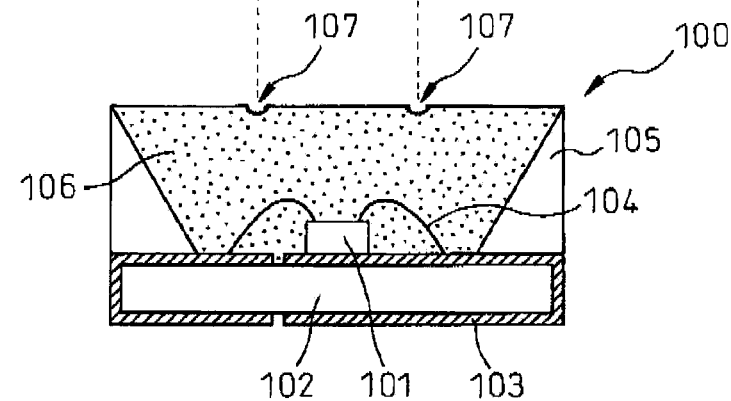

FIG. 1(a) is a top view of LED light source 100 and FIG. 1(b) is a cross-sectional view taken along line A-A' in FIG. 1(a).

An LED device 101 is disposed on a substrate comprised of a base 102 and a wiring conductor 109 and is electrically connected with wiring conductor 103 via bonding wires 104. Base 102 preferably has insulating and heat-resisting properties and it is made of glass epoxy, ceramic, BT resin, silicone and the like. LED device 101 is mounted on the substrate by using die bonding paste, Ag paste and the like. LED device 101 and wiring conductor 103 are supplied with electric power via bonding wires 104.

A sealing material 106 is formed around LED device 101 to protect LED device 101. As sealing material 106, transparent epoxy or silicone resin are used. Further, sealing material 106 includes a first fluorescent material mixed therewith. The first fluorescent material absorbs a portion of light emitted from LED device 101 and emits wavelength-converted light. Further, sealing material 106 may include a scattering material for uniformly scattering the light emitted from the LED device 101.

A reflective frame 105 is disposed outside sealing material 106. Reflective frame 105 is made of material having high surface reflectivity such as resin, ceramic, metallic material and the like, so as to efficiently radiate the light from LED light source 101 and the first fluorescent material to frontward.

In LED light source 100, a nitride compound semiconductor emitting blue light is used as LED device 101, while an yttrium-aluminum-garnet (YAG) fluorescent material activated with cerium is used as the first fluorescent material. As a result, LED light source 100 emits pseudo white light in which the blue light from LED device 101 and the yellow light from the first fluorescent material are mixed together.

On the other hand, in LED light source 100, 10 light scattering sections 107 are formed in a circle in a region 71 within a critical angle on a surface 108 of sealing material 106, so that the chromaticity of the light emitted from LED light source 100 is adjusted toward the yellow side on the chromaticity coordinates. Here, a dotted line 72 indicates a boundary of the region within the critical angle. The critical angle and the chromaticity adjustment will be explained later.

The light scattering section refers to a part where a pattern is formed to scatter light. The shape and size of the light scattering pattern does not have to be uniform and, for example, in place of a single-layered pattern, multiple light scattering patterns having various shapes and sizes may overlap to form the light scattering section. Here, when light going from the inside to the outside of LED light source 100 is scattered by light scattering sections 107 provided on surface 108, if 60% of the intensity of the original light is not scattered and does not change its direction and 40% of the intensity of the original light is scattered uniformly (i.e., more specifically, about 20% of the intensity of the original light is scattered to the outside of LED light source 100 and about 20% of the intensity of the original light is scattered to the inside of LED light source 100), scattering efficiency of the light scattering sections 107 is defined to be 40%. Similarly, when the light going from the inside to the outside of LED light source 100 is scattered by light scattering sections 107 provided on surface 108, if 40% of the intensity of the original light is not scattered and does not change its direction and 60% of the intensity of the original light is scattered uniformly (that is, more specifically, about 30% of the intensity of the original light is scattered to the outside of LED light source 100 and about 30% of the intensity of the original light is scattered to the inside of LED light source 100), the scattering efficiency of the light scattering sections 107 is defined to be 60%. Further, the LED device refers to a semiconductor light-emitting device, while the LED light source refers to a packaged electronic component on which the LED device and the like are mounted.

FIG. 2 is detail diagram of patterns of the light scattering sections.

Figure 2A:
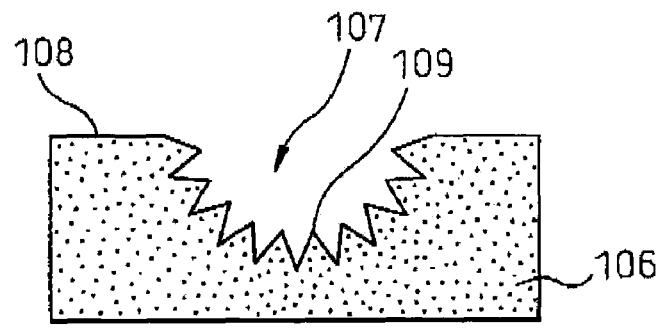
FIG. 2(a) is a diagram illustrating a light scattering section of an LED light source.

FIG. 2(a) is a diagram illustrating light scattering section 107 used in LED light source 100. Light scattering section 107 is formed as a dot-like recess and a plurality of projections and depressions 109 are formed on a surface of the recess to scatter the light. Projections and depressions 109 have a surface pattern that is obviously different from that of original flat surface 108 of the sealing material. The dot-like recess can be formed very easily by using a needle, for example. Light scattering projections and depressions 109 are formed by stabbing the surface of the sealing material with the needle.

Figure 2B:
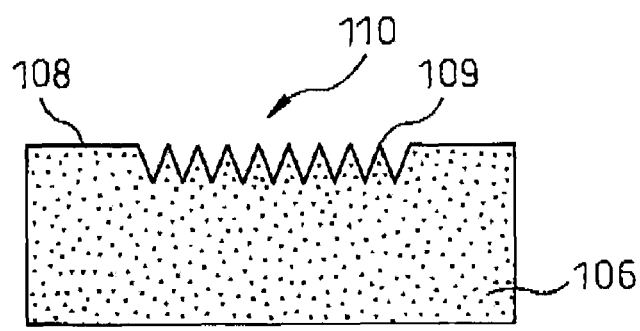
FIG. 2(b) is a diagram illustrating another light scattering section.

FIG. 2(b) is a diagram illustrating another light scattering section 110. In light scattering section 110, light scattering projections and depressions 109 are formed by scratching, grinding or polishing surface 108 of sealing material 106. Light scattering section 110 has an effect similar to that of light scattering section 107 illustrated in FIG. 2(a).

Figure 2C:
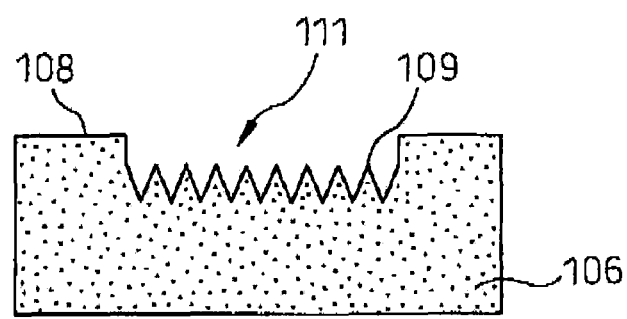
FIG. 2(c) is a diagram illustrating yet another light scattering section.

FIG. 2(c) is a diagram illustrating yet another light scattering section 111. In light scattering section 111, light scattering projections and depressions 109 are formed by grinding surface 108 of sealing material 106. Light scattering section 111 has an effect similar to that of light scattering section 107 illustrated in FIG. 2(a).

Figure 2D:
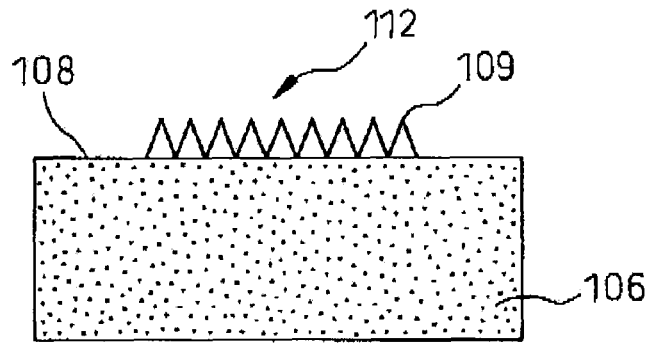
FIG. 2(d) is a diagram illustrating still another light scattering section.

FIG. 2(d) is a diagram illustrating still another light scattering section 112. In light scattering section 112, projections and depressions 109 are formed separately and adhered to surface 108 of sealing material 106 by adhesive tape and the like. Light scattering section 112 has an effect similar to that of light scattering section 107 illustrated in FIG. 2(a).

As described above, the light scattering sections may be formed in various ways. The light scattering sections described above are merely examples and it is possible to employ the light scattering sections that are formed in different ways. For example, the light scattering sections can be formed by adhering or embedding particles to or in surface 108 or by separately fabricating a light scattering pattern and adhering it to surface 108. The shape of the light scattering sections is not limited to the dot-like one but it may be various ones such as linear, planar and so on. The linear light scattering sections can be formed by using a cutter, a scriber and the like, and the planar light scattering sections can be easily implemented by polishing and the like. Further, in the forming process of the light scattering sections, no matter whether the light scattering sections have dot-like, linear, planar or other shapes, light scattering projections and depressions 109 are formed on their surfaces.

For example, nanocrystalline particles each having a diameter of 200 nm or less can be adhered to surface 108, so as to form light scattering sections that cause Rayleigh scattering that is stronger in the blue light emitted from LED device 101 than in the yellow light from the first fluorescent material. Rayleigh scattering refers to scattering that occurs when the length of the light scattering pattern is shorter than or approximately equal to the wavelength of the light. As described later, when the light scattering sections are formed in region 71 within the critical angle principally for the purpose of scattering the blue light, the light scattering sections that cause the Rayleigh scattering is particularly useful. Further, it is also possible to form light scattering sections that cause Mie scattering that occurs when the length of the light scattering pattern is longer than or equal to the wavelength of the light.

Next, an effect of chromaticity adjustment will be described.

As an example for illustrating the effect of the chromaticity, the number of light scattering sections 107 formed on surface 108 of sealing material 106 (See FIG. 2(a)) is changed incrementally to be 0, 5, 10, 15 and 20. Here, the case of 10 light scattering sections 107 corresponds to LED light source 100 illustrated in FIG. 1, while the case of 0 light scattering sections 107 corresponds to an LED light source 10 illustrated in FIG. 18.

Figure 3:
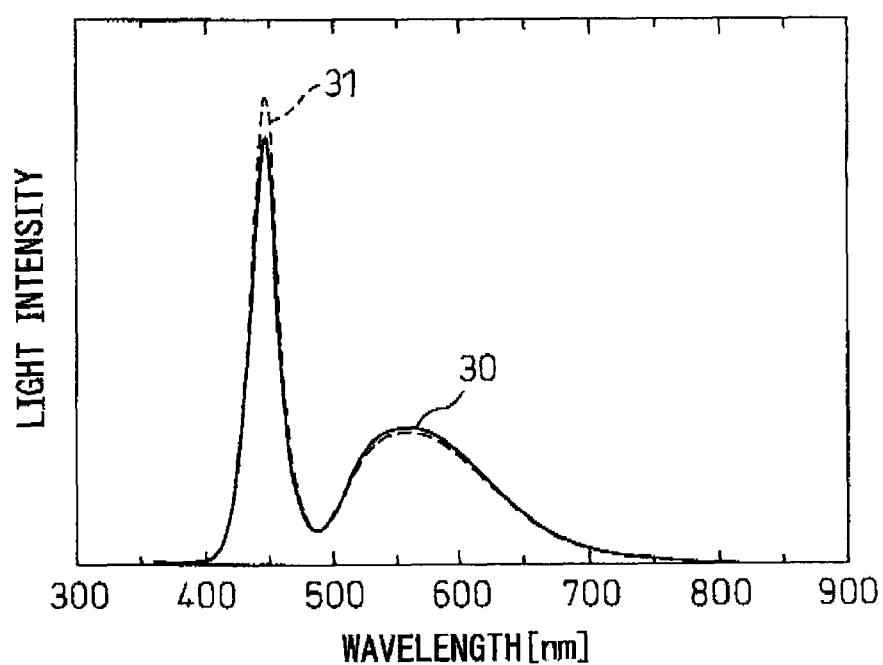
FIG. 3 is a diagram illustrating an exemplary emission spectrum of an LED light source.

FIG. 3 is a diagram illustrating an exemplary emission spectrum of an LED light source.

In FIG. 3, a dotted curve 31 indicates a spectrum of LED light source 10 in which light scattering sections 107 are not formed, while a solid curve 30 indicates a spectrum of an LED light source in which 20 light scattering sections 107 are formed.

As apparent from FIG. 3, if the light scattering sections are formed to adjust chromaticity, a spectrum of the LED light source is changed so that a peak around 450 am resulted from the blue LED is reduced and a peak around 560 nm resulted from the yellow fluorescent material is increased. Thus, by forming the light scattering sections, chromaticity coordinates of the LED light source can be shifted toward the yellow side.

Figure 4:
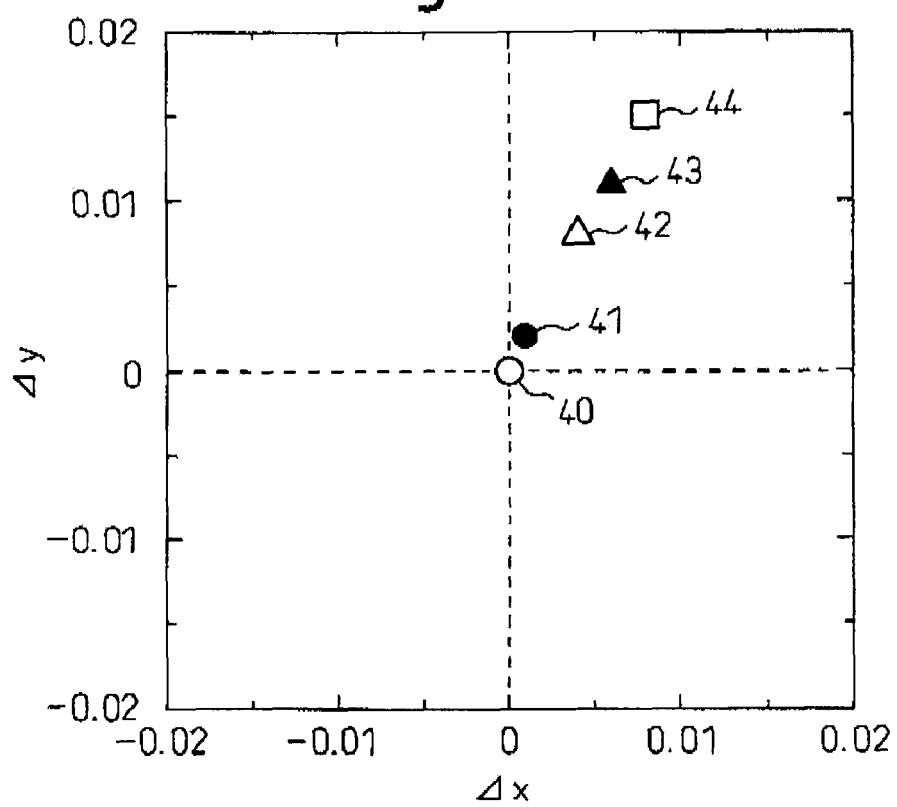
FIG. 4 is a diagram illustrating exemplary chromaticity coordinates.

FIG. 4 is a diagram illustrating exemplary chromaticity coordinates.

In FIG. 4, the vertical and horizontal axes represent chromaticity coordinate variation $\Delta y$ and $\Delta x$, respectively. Here, the chromaticity coordinate variation of the LED light source before the chromaticity adjustment (having 0 light scattering sections 107) is defined as an origin ($\Delta y$, $\Delta x$,) (0, 0).

In the figure, chromaticity coordinate variation 40 corresponds to the case of 0 light scattering sections 107, chromaticity coordinate variation 41 corresponds to the case of 5 light scattering sections 107, chromaticity coordinate variation 42 corresponds to the case of 10 light scattering sections 107, chromaticity coordinate variation 43 corresponds to the case of 15 light scattering sections 107, and chromaticity coordinate variation 44 corresponds to the case of 20 light scattering sections 107.

As understood from FIG. 4, the chromaticity coordinates of chromaticity coordinate variation 40 are (0, 0), the chromaticity coordinates of chromaticity coordinate variation 41 are (+0.001, +0.002), the chromaticity coordinates of chromaticity coordinate variation 42 are (+0.004, +0.008), the chromaticity coordinates of chromaticity coordinate variation 43 are (+0.006, +0.011), and the chromaticity coordinates of chromaticity coordinate variation 44 are (+0.008, +0.015), and therefore they incrementally move toward the yellow side. Thus, it can be understood that the number of light scattering sections 107 is approximately proportional to the amount of the chromaticity coordinate variation and, therefore, the chromaticity can be adjusted by forming the light scattering sections 107 of the number corresponding to the desired amount of the chromaticity coordinate variation.

Figure 5:
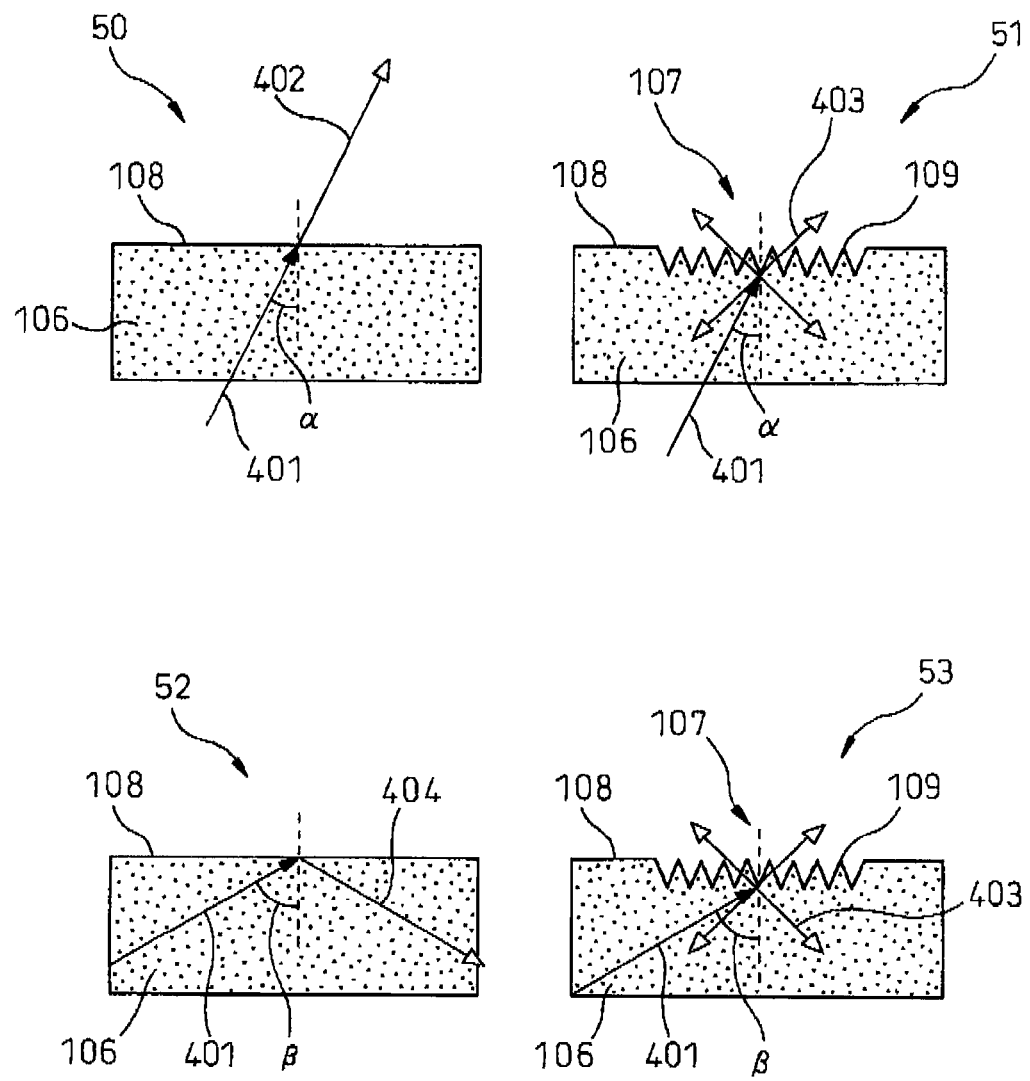
FIG. 5 is a diagram for describing behavior of light in a light scattering section.

FIG. 5 is a diagram describing behavior of light in a light scattering section.

Reference number 50 in FIG. 5 is a diagram illustrating an example of a light path at a point where there is no light scattering section. When light from LED device 101 reaches surface 108 of sealing material 106 from the inside of sealing material 106 at an angle $\alpha$ equal to or less than the critical angler incident light 401 from LED device 101 is almost not reflected but goes out into the atmosphere as transmitted light 402. Here, the critical angle is an angle inherent in LED light source 100 that is determined by a wavelength of the outgoing light from LED device 101, a refraction index of sealing material 106 and the like.

Reference number 51 in FIG. 5 is a diagram illustrating an example of a light path at the light scattering section. When light from LED device 101 reaches projections and depressions 109 formed in dot-like light scattering section 107 from the inside of sealing material 106 at angle $\alpha$ equal to or less than the critical angle, incident light 401 is scattered by projections and depressions 109 formed in light scattering section 107 and goes in various directions as scattered light 403. Thus, when there is the light scattering section at a point within the critical angle, in contrast to reference number 50 in FIG. 5, a portion of scattered light 403 returns to the inside of sealing material 106. Due to scattered light 403 returning to the inside of sealing material 106, the probability that the light emitted from LED device 101 impinges on the fluorescent material existing in sealing material 106 increases, and thus color conversion efficiency also increases. Therefore, the light scattering section provided at a point within the critical angle allows the yellow light due to the color conversion to increase, so that the chromaticity of the light emitted from LED light source 100 can be shifted toward the yellow side on the chromaticity coordinates. In this case, intensity of the light returning to the inside of LED light source 100 is determined by scattering efficiency of light scattering section 107.

Reference number 52 in FIG. 5 is a diagram illustrating an example of a light path at a point where there is no light scattering section. When the light from LED device 101 reaches surface 108 of sealing material 106 from the inside of sealing material 106 at an angle β equal to or more than the critical angle, almost all of impinging light 401 from LED device 101 is reflected on surface 108 of sealing material 106 and reflected light 404 returns to the inside of sealing material 106.

Reference number 53 in FIG. 5 is a diagram illustrating an example of a light path at the light scattering section. When light from LED device 101 reaches projections and depressions 109 formed in dot-like light scattering section 107 from the inside of sealing material 106 at angle β equal to or more than the critical angle, incident light 401 is scattered by projections and depressions 109 formed in light scattering section 107 and goes in various directions as scattered light 403. Thus, when there is the light scattering section at a point outside the critical angle, in contrast to reference number 52 in FIG. 5, a portion of scattered light 403 goes to the outside of sealing material 106. Due to scattered light 403 going to the outside of sealing material 106, the light returning to the inside of sealing material 106 decreases and, as a result, the probability that the light emitted from LED device 101 impinges on the fluorescent material decreases and, thus, the color conversion efficiency also decreases. Therefore, the light scattering section provided at a point outside the critical angle allows the yellow light due to the color conversion to decrease, so that the chromaticity of the light emitted from LED light source 100 can be shifted toward the blue side on the chromaticity coordinates. In this case, the intensity of the light returning to the inside of LED light source 100 is determined by scattering efficiency of light scattering section 107.

As described above, in LED light source 100 according to the present invention, the light scattering section 107 is formed at a portion of surface 108 of sealing surface 106 to generate scattered light 403 and change the optical path in LED device 100, so as to adjust the chromaticity of the LED light source. The chromaticity adjustment method described above is completely different in principle from the chromaticity adjustment as set forth in Patent Literature 1 that is performed by simply increasing or decreasing the amount of transparent resin 702. In LED light source 100 according to the present invention, light scattering sections 107 are formed at portions of surface 108 of sealing material 106, so that chromaticity can be adjusted easily while an outer shape of LED light source 100 is hardly changed and LED light source 100 is hardly damaged in the process of chromaticity adjustment.

FIG. 6 is a diagram describing distribution of chromaticity correction and the critical angle.

Figure 6A:
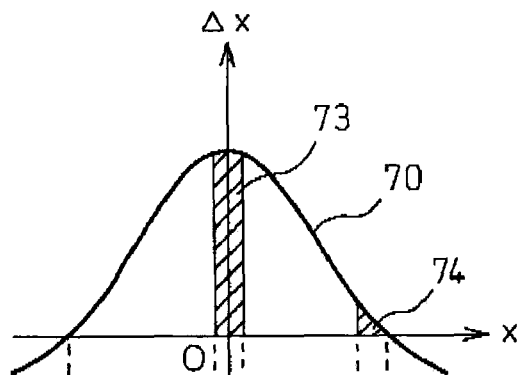
FIG. 6(a) illustrates an example of distribution of chromaticity correction ($\Delta x$)
Figure 6B:
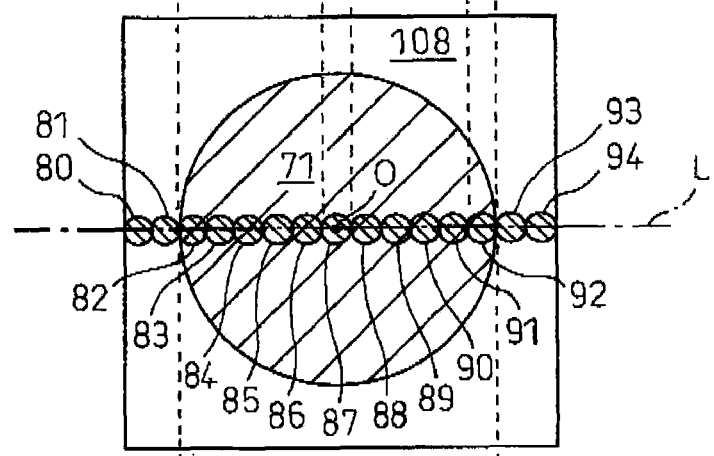
FIG. 6(b) illustrates a top view of an LED light source 10.
Figure 6C:
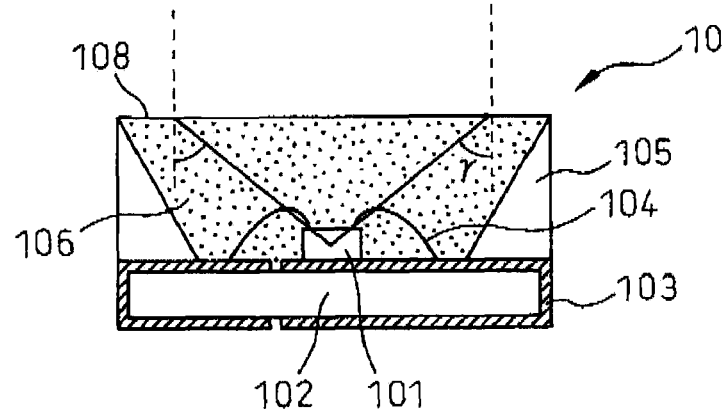
FIG. 6(c) is a cross-sectional view taken along line L in FIG. 6(b)

FIG. 6(a) illustrates an example of distribution of chromaticity correction (Δx), FIG. 6(b) illustrates a top view of an LED light source 10, and FIG. 6(c) is a cross-sectional view 62 taken along line L in FIG. 6(b).

FIG. 6(a) indicates distribution of chromaticity correction (Δx) 70 toward the yellow side by the light scattering sections provided on line L in FIG. 6(b). For example, as illustrated in FIG. 6(b), when only a light scattering section 86 is formed on surface 108, the chromaticity of the LED light source is corrected toward the yellow side by an amount corresponding to an area of a shaded part 73 in distribution of chromaticity correction 70 in FIG. 6(a). Similarly, as illustrated in FIG. 6(b), when only a light scattering section 92 having the scattering efficiency equal to that of light scattering section 86 is formed on surface 108, the chromaticity of the LED light source is corrected toward the yellow side by an amount corresponding to an area of a shaded part 74 in distribution of chromaticity correction 70 in FIG. 6(a). Thus, assuming that one light scattering section having a constant scattering efficiency and a constant area is formed on surface 108, chromaticity correction (Δx) by the light scattering section is larger in a central part of surface 108 than its peripheral part. It is because that the intensity of the blue light is high and, correspondingly, the scattering effect by light scattering section 87 is large at center O of surface 108 just below which the LED device is disposed. Further, at center O of surface 108, the light that is emitted from the LED device and that reaches surface 108 through the shortest optical path is less likely to encounter the fluorescent material and there is a greater probability that such light reaches surface 108 remaining as the blue light, and therefore the effect by light scattering section 87 is large. Thus, if distribution of chromaticity correction 70 is utilized, it can be determined in advance how the chromaticity of the LED light source can be changed by where and how the light scattering sections are formed.

In order to determine distribution of chromaticity correction 70 in FIG. 6(a), a colorimeter is fixedly disposed straight above center O of LED light source 10. First, only light scattering section 80 is formed on surface 108 to measure chromaticity and calculate the chromaticity correction or the chromaticity difference between when only light scattering section 80 is formed and when no light scattering section is formed. Next, light scattering section 81 is additionally formed to measure chromaticity and calculate the chromaticity correction or the chromaticity difference between when light scattering sections 80 and 81 are formed and when only light scattering section 80 is formed. In this manner, the chromaticity correction is calculated every time light scattering sections 80-94 are formed one by one on line L, so as to determine distribution of chromaticity correction 70 with regard to a specific LED light source.

Although distribution of chromaticity correction 70 in FIG. 6(a) is determined along line L in FIG. 6(b), it is also possible to determine the distribution of chromaticity correction two-dimensionally along surface 108. In this case, the chromaticity correction may be calculated every time a plurality of light scattering sections are formed one by one not only on a specific line as illustrated in FIG. 6(b) but also over the entire surface 108.

An angle γ illustrated in FIG. 6(c) is the critical angle and a region 71 in FIG. 6(b) indicates the region within the critical angle. As described with reference to FIG. 5, the light scattering sections can be provided in region 71 within the critical angle so as to adjust the chromaticity of the light emitted from LED light source 100 toward the yellow side on the chromaticity coordinates. Further, even on surface 108 of sealing material 106, the light scattering sections can be provided outside region 71 within the critical angle so as to adjust the chromaticity of the light emitted from LED light source 100 toward the blue side on the chromaticity coordinates.

FIG. 7 is a diagram illustrating examples of other LED light sources.

FIG. 7(a) is a diagram illustrating a top view of another LED light source 120 as well as its distribution of chromaticity correction. Similarly, FIG. 7(b) is a diagram illustrating a top view of yet another LED light source 130 as well as its distribution of chromaticity correction.

LED light sources 120 and 130 are similar to LED light source 100 illustrated in FIG. 1, except for the light scattering sections provided on surface 108 of sealing material 106, the further description of which is omitted. In FIGS. 7(a) and 7(b), dotted lines 72 indicate boundaries of regions within the critical angle. (See FIGS. 6(a)-6(c).)

In LED light source 120 illustrated in FIG. 7(a), a circular light scattering section 121 is formed in the region on surface 108 within the critical angle. Similarly to light scattering section 110 illustrated in FIG. 2(b), light scattering section 121 is formed by polishing surface 108. However, other light scattering sections such as those illustrated in FIGS. 2(a), 2(c), 2(d) and so on may be formed.

By providing light scattering section 121 in the region on surface 108 within the critical angle as illustrated in FIG. 7(a), the chromaticity of the outgoing light from LED light source 120 can be adjusted toward the yellow side on the chromaticity coordinates. Further, as illustrated in FIG. 7(a), the chromaticity correction by light scattering section 121 corresponds to an area of a shaded part 75.

In LED light source 130 illustrated in FIG. 7(b), four dot-like light scattering sections 131-134 are formed in the region on surface 108 within the critical angle. It is assumed that four light scattering sections 131-134 have the same scattering efficiency as light scattering section 121 in FIG. 7(a).

By providing four light scattering sections 131-134 in the region on surface 108 within the critical angle as illustrated in FIG. 7(b), the chromaticity of the outgoing light from LED light source 130 can be adjusted toward the yellow side on the chromaticity coordinates. Further, as illustrated in FIG. 7(b), the chromaticity correction by light scattering sections 131-134 corresponds to a total area of shaded parts 76. By comparing shaded parts 76 with shaded part 75 in distribution of chromaticity correction 70 illustrated in FIG. 7(a), the degree of the chromaticity correction by light scattering sections 131-134 can be known.

FIG. 8 is a diagram illustrating examples of still another LED light source.

FIG. 8(a) is the same diagram as FIG. 7(a). FIG. 8(b) is a diagram illustrating a top view of still another LED light source 140 as well as its distribution of chromaticity correction.

LED light source 140 is similar to LED light source 100 illustrated in FIG. 1, except for the light scattering section provided on surface 108 of sealing material 106, the further description of which is omitted. In FIG. 8(b), dotted line 72 indicates the boundary of the region within the critical angle (See FIGS. 6(a)-6(c)), and dotted line 121 indicates a contour of light scattering section 121.

In LED light source 140, a circular light scattering section 141 that is smaller than light scattering section 121 illustrated in FIG. 8(a) is formed in the region on surface 108 within the critical angle. Similarly to light scattering section 131 illustrated in FIG. 8(b), light scattering section 141 is formed by polishing surface 108 and it has a scattering efficiency similar to that of light scattering section 121.

By providing light scattering section 141 in the region on surface 108 within the critical angle as illustrated in FIG. 7(b), the chromaticity of the outgoing light from LED light source 140 can be adjusted toward the yellow side on the chromaticity coordinates. Further, the chromaticity correction by light scattering section 141 illustrated in FIG. 8(b) corresponds to an area of a shaded part 77 in distribution of chromaticity correction 70. By comparing shaded part 77 with shaded part 75 in distribution of chromaticity correction 70 illustrated in FIG. 8(a), the degree of the chromaticity correction by light scattering section 141 can be known. Thus, assuming that the light scattering section has a constant scattering efficiency, it is possible to change the amount of chromaticity correction (that is to say, chromaticity adjustment) by changing the area of the light scattering section.

FIG. 9 is a diagram illustrating examples of still another LED light source.

Figure 9A:
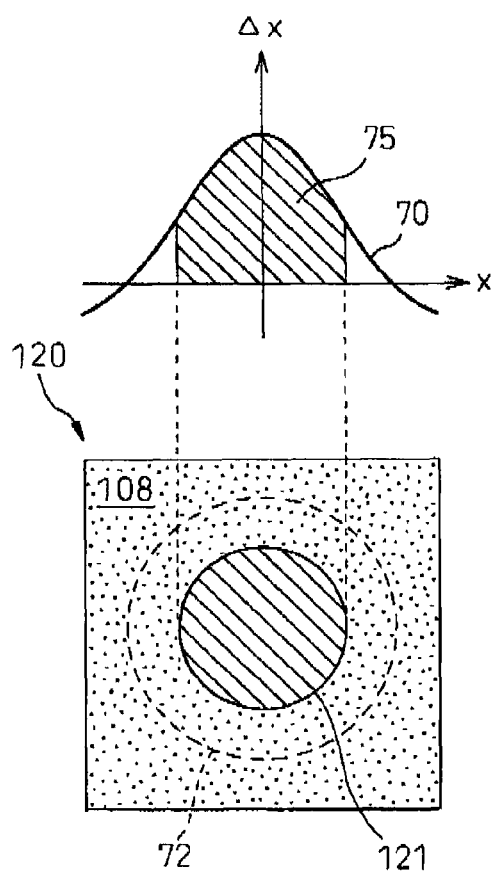
FIG. 9(a) is a diagram similar to FIG. 7(a)
Figure 9B:
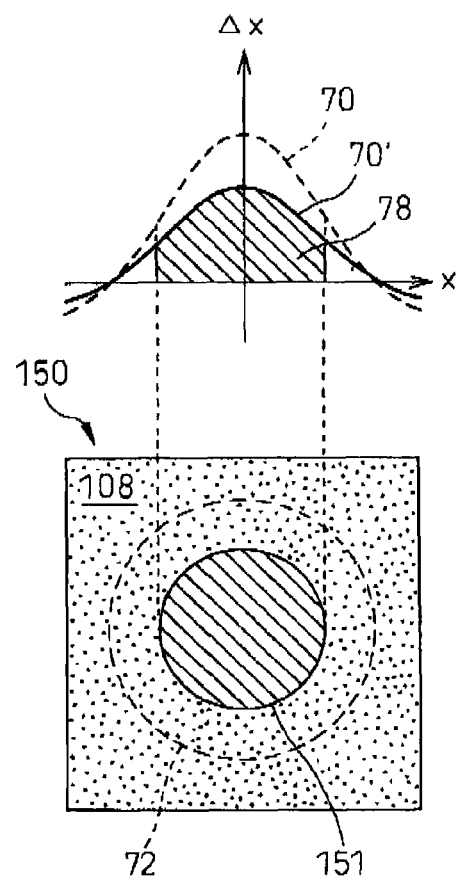
FIG. 9(b) is a diagram illustrating a top view of still another LED light source 150 as well as its distribution of chromaticity correction.

FIG. 9(a) is the same diagram as FIG. 7(a). FIG. 9(b) is a diagram illustrating a top view of still another LED light source 150 as well as its distribution of chromaticity correction.

LED light source 150 is similar to LED light source 100 illustrated in FIG. 1, except for the light scattering section provided on surface 108 of sealing material 106, the further description of which is omitted. In FIG. 9(b), dotted line 72 indicates the boundary of the region within the critical angle (See FIGS. 6(a)-6(c)).

In LED light source 150 illustrated in FIG. 9(b), a circular light scattering section 151 is formed in the region on surface 108 within the critical angle. Similarly to light scattering section 110 illustrated in FIG. 2(b), light scattering section 151 is formed by polishing surface 108 and light scattering section 151 is configured so that its area is the same as that of light scattering section 121 illustrated in FIG. 9(a) but its scattering efficiency is lower than that of light scattering section 121.

By providing light scattering section 151 in the region on surface 108 within the critical angle as illustrated in FIG. 9(b), the chromaticity of the outgoing light from LED light source 150 can be adjusted toward the yellow side on the chromaticity coordinates. Further, the chromaticity correction by light scattering section 151 illustrated in FIG. 9(b) corresponds to an area of a shaded part 78 in distribution of chromaticity correction 70' in FIG. 9(b). Because light scattering section 151 is configured so that its area is similar to that of light scattering section 121 but its scattering efficiency is lower than that of light scattering section 121, it can be understood that the chromaticity correction of light scattering section 151 is smaller than that of light scattering section 121.

FIG. 10 is diagram illustrating examples of still another LED light source.

Figure 10A:
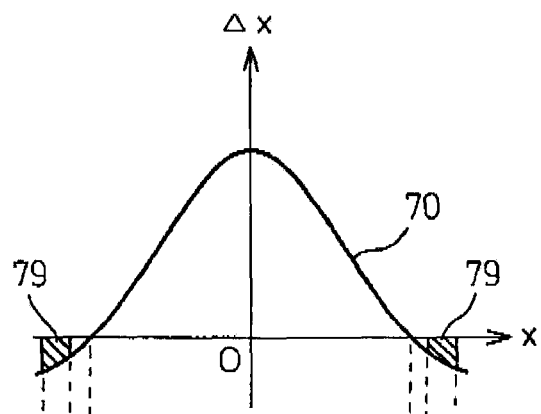
FIG. 10(a) illustrates an example of distribution of chromaticity correction of an LED light source 160.
Figure 10B:
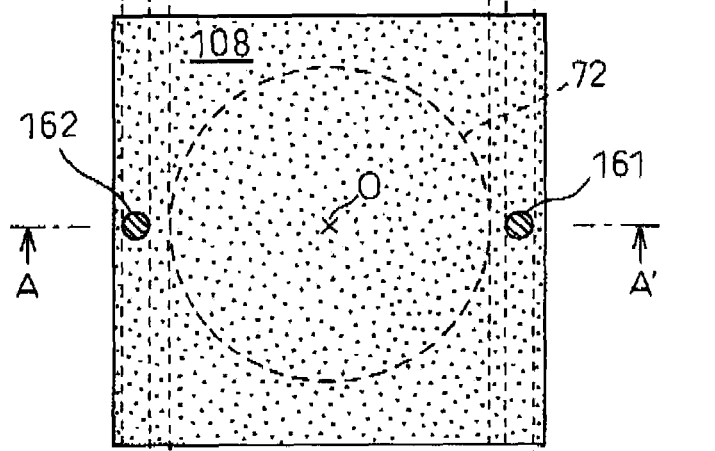
FIG. 10(b) illustrates a top view of LED light source 160.
Figure 10C:
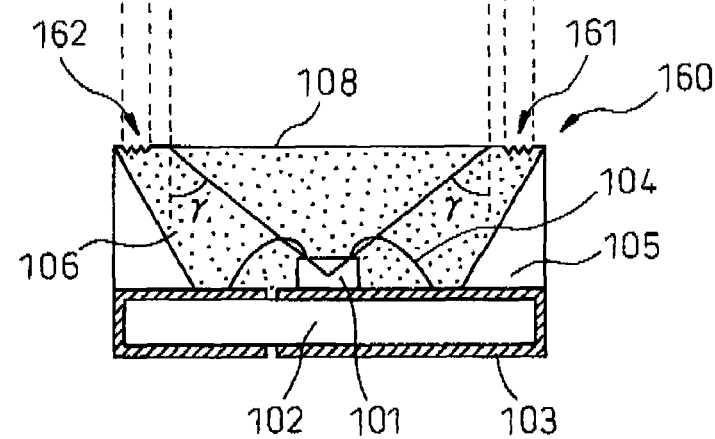
FIG. 10(c) is a cross-sectional view taken along line A-A' in FIG. 10(b)

FIG. 10(a) illustrates an example of distribution of chromaticity correction of an LED light source 160, FIG. 10(b) illustrates a top view of LED light source 160, and FIG. 10(c) is a cross-sectional view taken along line A-A' in FIG. 10(b).

LED light source 160 illustrated in FIGS. 10(a)-10(c) differs from LED light source 100 illustrated in FIGS. 1(a) and 1(b) only in that LED light source 160 has light scattering sections 161 and 162 provided on its surface 108, and therefore the description of other elements are omitted. In FIG. 10(b), dotted line 72 indicates the boundary of the region within the critical angle. (See FIGS. 7(a) and 7(b).)

Light scattering sections 161 and 162 are formed by polishing surface 108 similarly to light scattering section 110 illustrated in FIG. 2(b) and it has a scattering efficiency similar to that of light scattering section 110. However, other light scattering sections such as those illustrated in FIGS. 2(a), 2(c) and 2(d) and the like may be formed. Further, light scattering sections 161 and 162 are disposed outside the region within the critical angle. As illustrated in FIGS. 10(a)-10(c), by providing two light scattering sections 161 and 162 outside the region of surface 108 within the critical angle, the chromaticity of the outgoing light from LED light source 160 can be adjusted toward the blue side on the chromaticity coordinates. Further, the chromaticity correction toward the yellow side by light scattering section 161 illustrated in FIG. 10(b) corresponds to an area of a shaded part 79 in distribution of chromaticity correction 70 in FIG. 10(a). Here, the fact that shaded part 79 lies on the minus side in FIG. 10(a) means that light scattering section 161 can adjust the chromaticity of the outgoing light of LED light source 160 toward the blue side on the chromaticity coordinates.

FIG. 11 is a diagram illustrating other exemplary chromaticity coordinates.

In FIG. 11, the vertical and horizontal axes represent chromaticity coordinate variation Δy and Δx, respectively. Here, the chromaticity coordinate variation of the LED light source before the chromaticity adjustment (when no light scattering section is formed) is defined as an origin (Δy, Δx,)=(0, 0).

In the figure, chromaticity coordinate variation 80 indicates the case in which there is no light scattering section (corresponding to LED light source 10 in FIG. 18), and chromaticity coordinate variation 81 indicates the case in which light scattering sections 161 and 162 are provided outside the region on surface 108 within the critical angle (corresponding to LED light source 160 in FIGS. 10(a)-10(c).

Further, as understood from FIG. 11, the chromaticity coordinates of chromaticity coordinate variation 80 are (0, 0), and the chromaticity coordinates of chromaticity coordinate variation 81 are (0.0018, −0.0024), and thus they move toward the blue side. Therefore, it can be understood that the chromaticity can be adjusted toward the blue side by providing the light scattering sections outside the region on surface 108 within the critical angle.

FIG. 12 is a diagram illustrating examples of still other LED light sources.

Figure 12A:
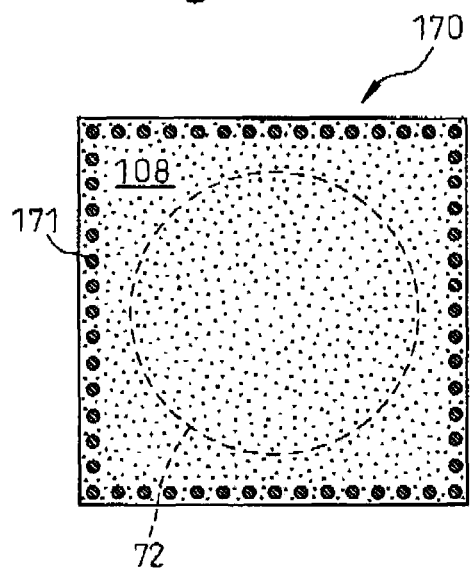
FIG. 12(a) is a top view of an LED light source 170.

FIG. 12(a) is a top view of an LED light source 170. LED light source 170 illustrated in FIG. 12(a) differs from LED light source 100 illustrated in FIGS. 1(a) and 1(b) only in that LED light source 170 has light scattering sections 171 provided on its surface 108 and, therefore, the description of other elements are omitted. In FIG. 12(a), dotted line 72 indicates the boundary of the region within the critical angle. (See FIGS. 7(a) and 7(b).) In the LED light source 170, a plurality of dot-like light scattering sections 171 are disposed along an outer edge of top surface 108 of LED light source 170 outside the region within the critical angle. The plurality of light scattering sections 171 are recesses formed by using a needle similarly to light scattering section 107 illustrated in FIG. 2(a). However, other light scattering sections such as those illustrated in FIGS. 2(b)-2(d) and the like may be formed. The chromaticity of the outgoing light from LED light source 170 can be adjusted toward the blue side on the chromaticity coordinates by providing the plurality of light scattering sections 172, as illustrated in FIG. 12(a) on surface 108 outside the region within the critical angle.

Figure 12B:
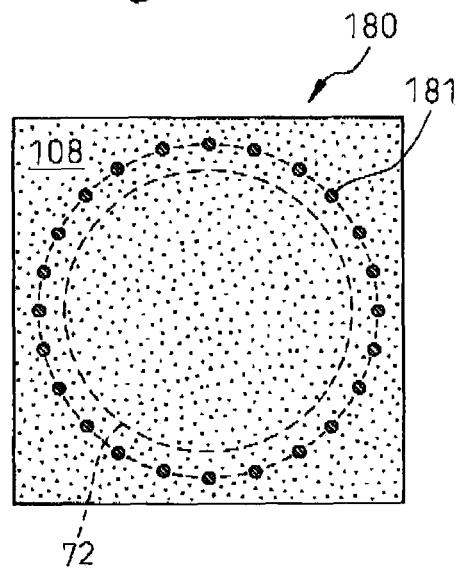
FIG. 12(b) is a top view of an LED light source 180.

FIG. 12(b) is a top view of an LED light source 180. LED light source 180 illustrated in FIG. 12(b) differs from LED light source 100 illustrated in FIGS. 1(a) and 1(b) only in that LED light source 180 has light scattering sections 181 provided on its surface 108, and therefore the description of other elements are omitted. In FIG. 12(b), dotted line 72 indicates the boundary of the region within the critical angle. (See FIGS. 7(a) and 7(b).) In LED light source 180, a plurality of dot-like light scattering sections 181 are disposed in a circle outside the region within the critical angle. The plurality of light scattering sections 181 are recesses formed by using a needle similarly to light scattering section 107 illustrated in FIG. 2(a). However, other light scattering sections such as those illustrated in FIGS. 2(b)-2(d) and the like may be formed. The chromaticity of the outgoing light from LED light source 180 can be adjusted toward the blue side on the chromaticity coordinates by providing the plurality of light scattering sections 181 as illustrated in FIG. 12(b) on surface 108 outside the region within the critical angle.

Figure 12C:
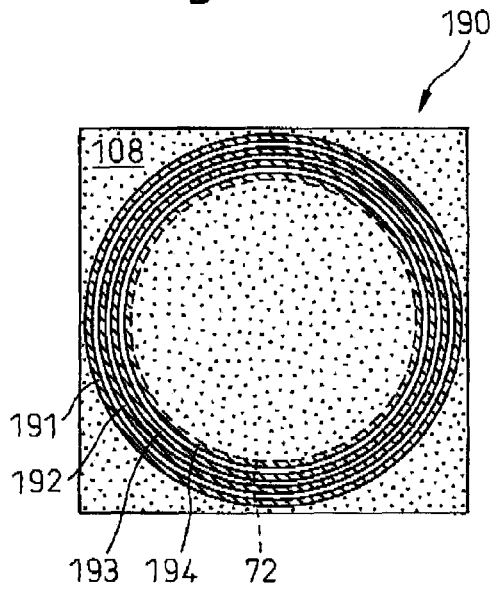
FIG. 12(c) is a top view of an LED light source 190.

FIG. 12(c) is a top view of an LED light source 190. LEO light source 190 illustrated in FIG. 12(c) differs from LED light source 100 illustrated in FIGS. 1(a) and 1(b) only in that LED light source 190 has light scattering sections 191-194 provided on its surface 108 and, therefore, the description of other elements are omitted. In FIG. 12(c), dotted line 72 indicates the boundary of the region within the critical angle. (See FIGS. 7(a) and 7(b).) In LED light source 190, a plurality of band-like light scattering sections 191-194 are disposed concentrically outside the region within the critical angle. The plurality of light scattering sections 191-194 are formed by polishing the surface similarly to light scattering section 110 illustrated in FIG. 2(b). However, other light scattering sections such as those illustrated in FIGS. 2(a), 2(c) and 2(d) and the like may be formed. The chromaticity of the outgoing light from LED light source 190 can be adjusted toward the blue side on the chromaticity coordinates by providing the plurality of light scattering sections 191-194 as illustrated in FIG. 12(c) on surface 108 outside the region within the critical angle.

Figure 12D:
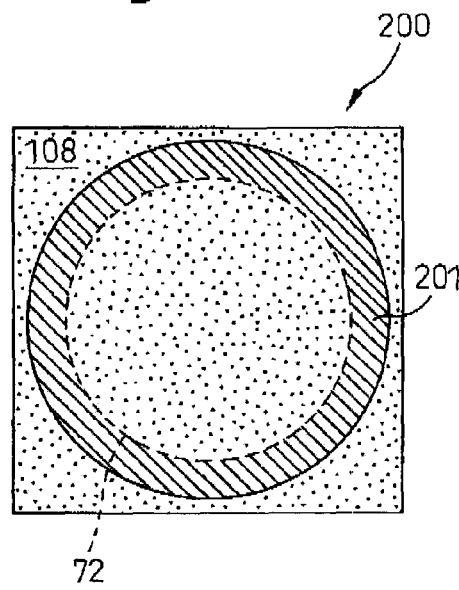
FIG. 12(d) is a top view of an LED light source 200.

FIG. 12(d) is a top view of an LED light source 200. LED light source 200 illustrated in FIG. 12(d) differs from LED light source 100 illustrated in FIG. 1(a) and 1(b) only in that LED light source 200 has a light scattering section 201 provided on its surface 108 and, therefore, the description of other elements are omitted. In FIG. 12(d)<dotted line 72 indicates the boundary of the region within the critical angle. (See FIGS. 7(a) and 7(b).) In LED light source 200, a band-like light scattering section 201 is disposed outside the region within the critical angle. Light scattering section 201 is formed by polishing the surface similarly to light scattering section 110 illustrated in FIG. 2(b). However, other light scattering sections such as those illustrated in FIGS. 2(a), 2(c) and 2(d) and the like may be formed. The chromaticity of the outgoing light from LED light source 200 can be adjusted toward the blue side on the chromaticity coordinates by providing light scattering section 200 as illustrated in FIG. 12(d) on surface 108 outside the region within the critical angle.

FIG. 13 is a diagram describing displacement of the light scattering section.

FIG. 13(a) illustrates a state similar to FIG. 7(a). Thus, light scattering section 121 is provided on surface 108 in the region within the critical angle so as to adjust the chromaticity of the outgoing light from LED light source 120 toward the yellow side on the chromaticity coordinates.

FIG. 13(b) illustrates an LED light source 120' in which light scattering section 121 of FIG. 13(a) is displaced as it is rightward in the figure by a distance d and designated a light scattering section 122. A shaded part 75 in distribution of chromaticity correction 70 in FIG. 13(a) indicates the chromaticity correction of LED light source 120, while a shaded part 125 in distribution of chromaticity correction 70 in FIG. 13(b) indicates the chromaticity correction of LED light source 120'. Further, from FIGS. 13(a) and 13(b), it can be found that an area of shaded part 75>an area of shaded part 125. Thus, the chromaticity correction can be changed (adjusted) by displacing the light scattering section of a constant shape and area on surface 108.

Although both light scattering sections 121 and 122 are provided inside the region within the critical angle, a light scattering section 123 is displaced further so that its portion is disposed outside the region within the critical angle and the chromaticity is adjusted differently.

FIG. 14 is a diagram illustrating an example of the displaced LED light source.

FIG. 14(a) is a top view and a cross-sectional view taken along line A-A' corresponding to FIG. 13(a). Further, FIG. 14(b) is a top view and a cross-sectional view taken along line A-A' corresponding to FIG. 13(b).

LED light source 120' illustrated in FIG. 14(b) differs from LED light source 100 illustrated in FIGS. 1(a) and 1(b) only in that LED light source 120' has a light scattering section 122 provided thereon and, therefore, the description of other elements are omitted.

Figure 15:
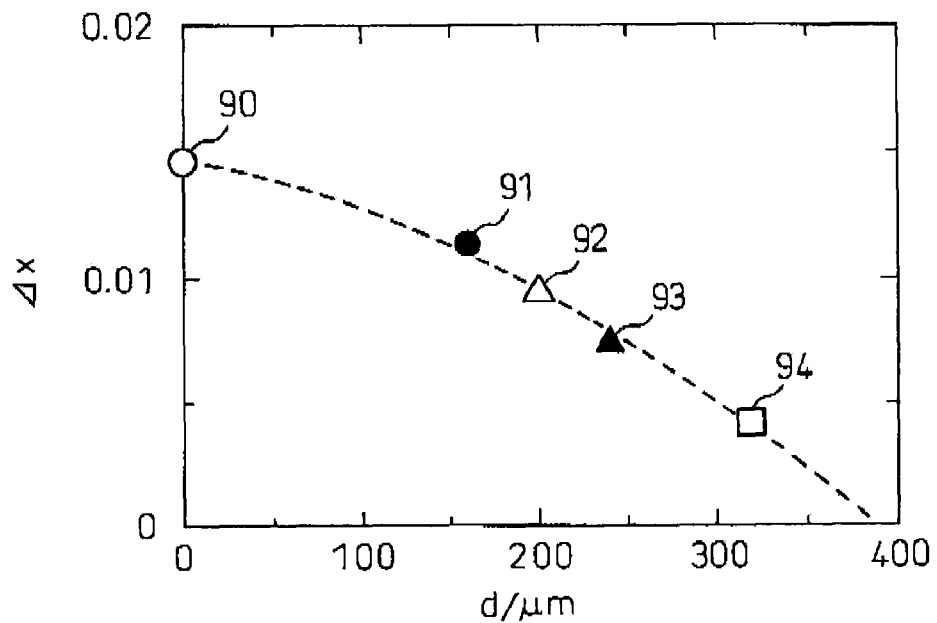
FIG. 15 is a diagram illustrating a relationship between displacement distance d and chromaticity correction Δx.

FIG. 15 is a diagram illustrating the relationship between displacement distance (d) and chromaticity correction Δx.

Displacement distance (d) of the light scattering section of the scattering efficiency and shape and area same as those of light scattering section 121 illustrated in FIGS. 14(a) and 14(b) is changed and the chromaticity correction Δx is measured. As illustrated in FIG. 15, there is a certain correlation between points 90, 91, 92, 93 and 94 that indicate the chromaticity correction when displacement distance d=0, 170, 200, 220 and 310 μm, respectively.

Figure 16:
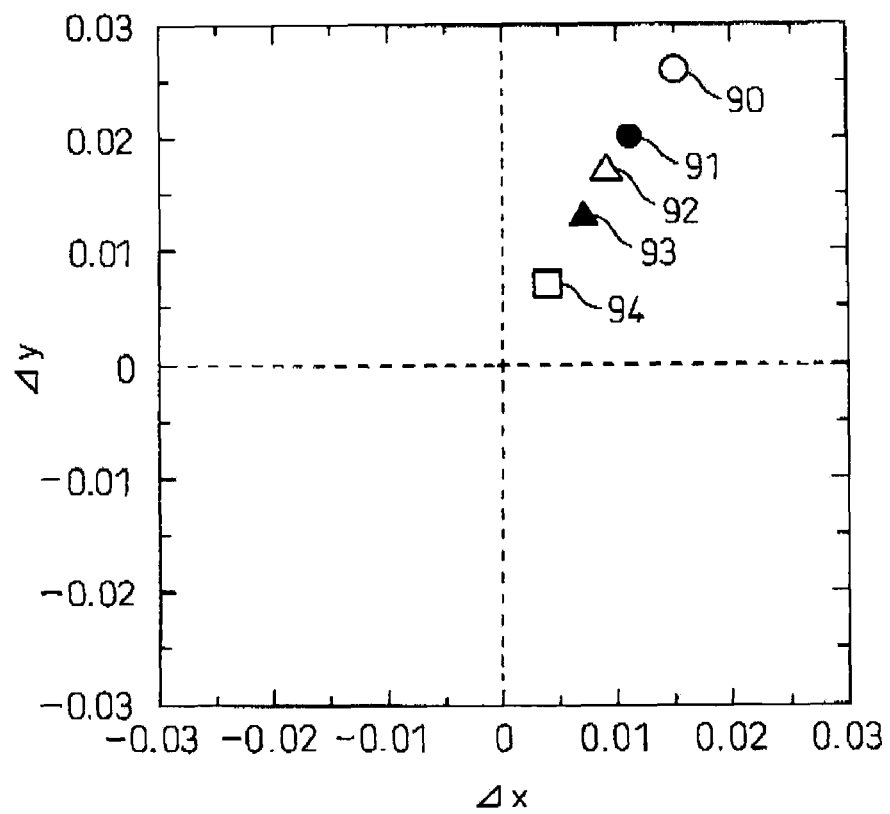
FIG. 16 is a diagram illustrating yet other exemplary chromaticity coordinates.

FIG. 16 is a diagram illustrating yet other exemplary chromaticity coordinates.

In FIG. 16, the vertical and horizontal axes represent chromaticity coordinate variation Δy and Δx, respectively. The chromaticity coordinate variation of the LED light source before the chromaticity adjustment (when no light scattering section is formed) is defined as an origin (Δy, Δx,)=(0, 0). Further, points 90-94 in FIG. 16 correspond to points 90-94 in FIG. 15, respectively.

As seen from FIGS. 15 and 16, the degree of chromaticity correction can be corrected by changing displacement distance d of the light scattering section that is formed by a constant method and that has a constant size. Thus, the chromaticity of the light emitted from LED light source 120 can be adjusted toward the yellow side on the chromaticity coordinates by forming light scattering section 121 illustrated in FIG. 14(a), and further, the chromaticity of the light emitted from LED light source 120' can be adjusted stepwise toward the blue side on the chromaticity coordinates by increasing displacement distance d of the light scattering section of the same shape as light scattering section 121.

FIG. 17 is a diagram illustrating patterns of light scattering sections that may be displaced when they are formed.

Figure 17A:
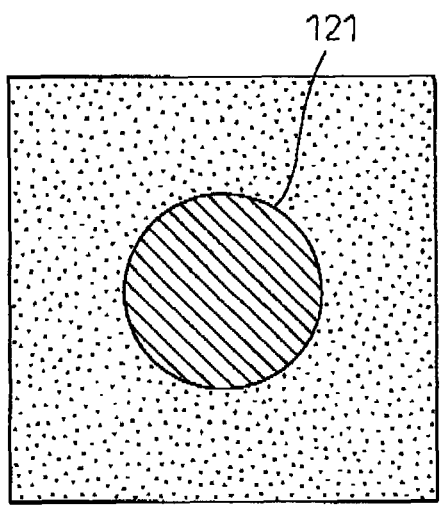
FIG. 17(a) illustrates a pattern similar to light scattering section 121 illustrated in FIG. 14(a)

FIG. 17(a) illustrates a pattern similar to light scattering section 121 illustrated in FIG. 14(a).

Figure 17B:
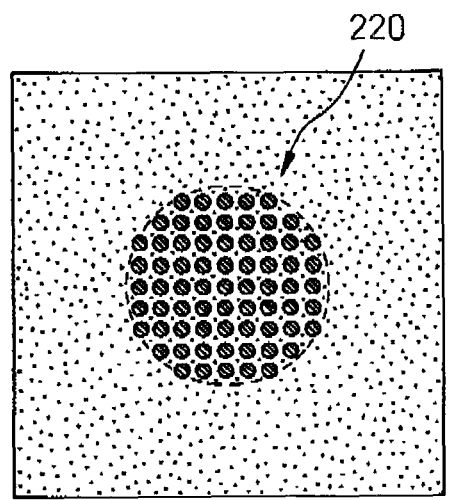
FIG. 17(b) illustrates a pattern in which a plurality of circular dot-like light scattering sections 220 are formed.
Figure 17C:
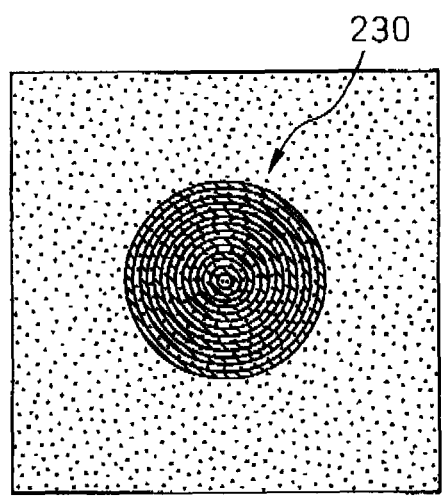
FIG. 17(c) illustrates a pattern in which a plurality of band-like light scattering sections 230 are formed concentrically.
Figure 17D:
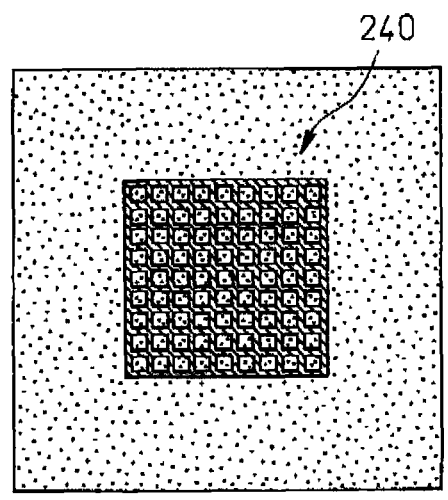
FIG. 17(d) illustrates a pattern in which small square-like light scattering sections 240 are formed in a matrix manner.

FIG. 17(b) illustrates a pattern in which a plurality of circular dot-like light scattering sections 220 are formed in the area substantially equal to that of light scattering section 121. Further, FIG. 17(c) illustrates a pattern in which a plurality of band-like light scattering sections 230 are formed concentrically in the area substantially equal to that of light scattering section 131. Still further, FIG. 17(d) illustrates a pattern in which small square-like light scattering sections 240 are formed in a matrix manner in a large square of a predetermined size. FIGS. 17(a)-17(d) illustrate merely examples, and other patterns may also be employed for the light scattering sections that may be displaced when they are formed.

Hereinafter, a chromaticity adjustment method for an LED light source will be described.

Figure 18:
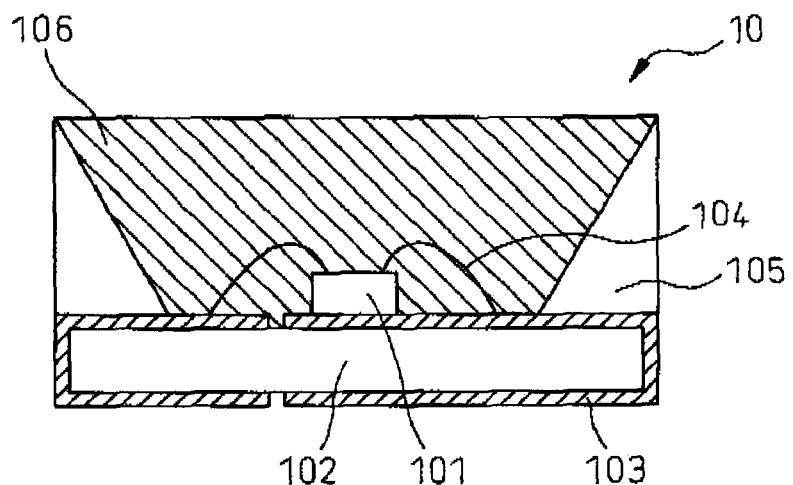
FIG. 18 is a cross-sectional view of a white LED light source 10.
Figure 19:
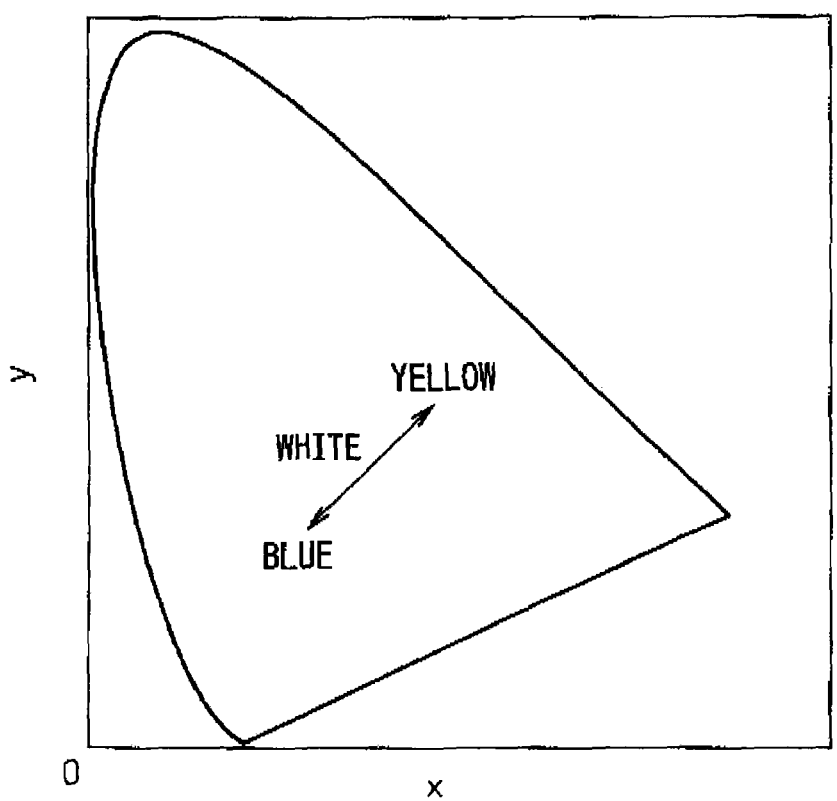
FIG. 19 is a diagram illustrating an example of chromaticity coordinates.
Figure 20A:
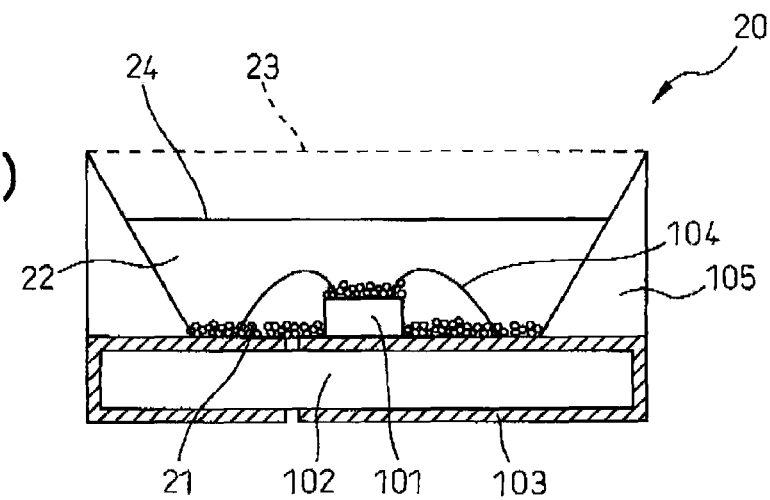
FIG. 20(a) is a diagram illustrating an example in which a transparent resin in an upper part is polished until a desired chromaticity is obtained.
Figure 20B:
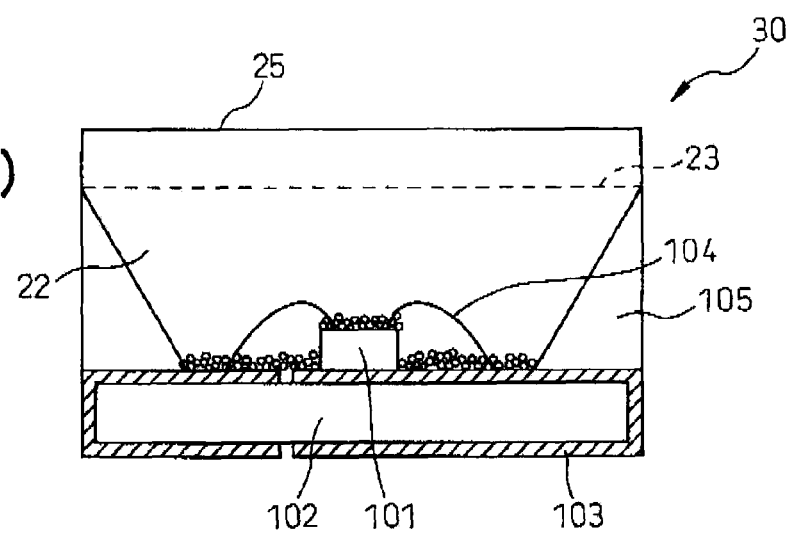
FIG. 20(b) is a diagram illustrating an example in which a resin surface is raised by adding further resin thereto.

First, LED light source 10 in which no light scattering section is formed as illustrated in FIG. 18 is fabricated and, then, the LED light source is allowed to emit light so as to measure chromaticity of the emitted light.

Next, if the measured chromaticity is not desired one, light scattering sections are formed on surface 108 of the LED light source to perform adjustment according to the difference between the measured chromaticity and the desired chromaticity. The relationship between chromaticity differences and types of the light scattering sections to be formed may be determined in advance and the light scattering sections may be formed according to the relationship, so as to save cost and time consumed for the chromaticity adjustment. For example, if there is a medium difference toward the blue side, 10 dot-like light scattering sections 107 are formed as illustrated in FIGS. 1(a) and 1(b); if there is a small difference toward the blue side, 5 dot-like light scattering sections 107 illustrated in FIGS. 1(a) and 1(b) are formed in a circle; if there is a large difference toward the blue side, 20 dot-like light scattering sections 107 illustrated in FIGS. 1(a) and 1(b) are formed in a circle; and so on.

Further, as explained with reference to FIGS. 14(a) and 14(b), the chromaticity adjustment is also possible by forming the light scattering sections which always have the same scattering efficiency and shape and area as scattering section 121 illustrated in FIG. 14(a) and changing its forming position or, in other words, displacement distance (d) according to the chromaticity difference. In this case, the relationship between the chromaticity differences and the displacement distances may be defined in a table and the like and, based on the measurement result, the light scattering sections may be formed according to displacement distances (d).

Thus, in order to reduce manufacturing cost of the LED light source, it is very effective to adjust the chromaticity by displacing the light scattering sections formed by a constant method. More specifically, not by preparing plural types of light scattering sections and forming any of them on the surface of the LED light source according to difference between the measured chromaticity and the desired chromaticity, but by displacing the light scattering sections of constant scattering efficiency and constant shapes and areas, the light scattering sections can be formed very easily, and therefore the manufacturing cost can be reduced.

Although the above examples have been explained with reference to the LED light source that emits pseudo white light by using the LED device emitting blue light and the fluorescent material absorbing the blue light and emitting yellow light, the present invention is not limited to this combination and it may also be applied to other types of LED light sources. For example, the present invention can be applied to an LED light source that emits pseudo-blue-green light by using an LED device emitting blue light and a fluorescent material absorbing blue light and emitting G-color light and an LED light source that emits pseudo-purple light by using an LED device emitting blue light and a fluorescent material absorbing blue light and emitting R-color light as well as their chromaticity correction.

Further, the present invention can be applied to an LED light source that comprises an LED device emitting blue light and a sealing resin mixed with plural types of fluorescent materials such as, for example, a fluorescent material emitting G-color (hereinafter referred to as the "G-color fluorescent material") and a fluorescent material emitting R-color (hereinafter referred to as the "R-color fluorescent material"). For example, by using light scattering sections provided on a surface of an RGB-LED light source, chromaticity of the RGB-LED light source can be adjusted on a line on chromaticity coordinates determined by a mixing ratio between the G-color fluorescent material and the R-color fluorescent material.

Still further, the present invention can be applied to an LED light source including not only an LED device emitting blue light but also an LED light source emitting G-color light.

What is claimed is:
1. A chromaticity adjustment method in an LED light source having an LED device, a fluorescent material that absorbs and wavelength-converts a portion of light emitted from said LED device to emit light from itself, and a sealing material that includes said fluorescent material and that is disposed around said LED device, comprising the steps of:

forming light scattering sections on a surface of said sealing material that scatter a portion of light emitted from said LED device for adjusting chromaticity of said LED light source; and measuring chromaticity of said LED light source, wherein the light scattering sections are formed on the surface of said sealing material that scatter a portion of light emitted from said LED device according to chromaticity correction amount for adjusting the measured chromaticity to the desired chromaticity.

2. The chromaticity adjustment method according to claim 1, wherein said light scattering sections include projections and depressions formed as dots.

3. The chromaticity adjustment method according to claim 1, wherein said light scattering sections include projections and depressions formed in the form of lines.

4. The chromaticity adjustment method according to claim 1, wherein said light scattering sections include projections and depressions formed in the form of planes.

5. A chromaticity adjustment method in an LED light source having an LED device, a fluorescent material that absorbs and wavelength-converts a portion of light emitted from said LED device to emit light from itself, and a sealing material that includes said fluorescent material and that is disposed around said LED device, comprising the step of:

forming light scattering sections that scatter a portion of light emitted from said LED device for adjusting chromaticity while displacing their positions on a surface of said sealing material according to the chromaticity adjustment of said LED light source.

6. The chromaticity adjustment method according to claim 5, wherein said light scattering sections include projections and depressions formed as dots.

7. A chromaticity adjustment method according to claim 5, wherein said light scattering sections include projections and depressions formed in the form of lines.

8. The chromaticity adjustment method according to claim 5, wherein said light scattering sections include projections and depressions formed in the form of planes.

9. The chromaticity adjustment method according to claim 5, wherein said LED device emits blue light and said fluorescent material absorbs the blue light and emits yellow light so that said LED light source emits pseudo white light, wherein said light scattering sections are formed in a region within a critical angle so as to adjust chromaticity of the pseudo white light emitted from said LED light source toward the yellow side.

10. The chromaticity adjustment method according to claim 5, wherein said LED device emits blue light and said fluorescent material absorbs the blue light and emits yellow light so that said LED light source emits pseudo white light, wherein said light scattering sections are formed outside a region within a critical angle so as to adjust chromaticity of the pseudo white light emitted from said LED light source toward the blue side.

11. A chromaticity adjustment method in an LED light source having an LED device, a fluorescent material that absorbs and wavelength-converts a portion of light emitted from said LED device to emit light from itself, and a sealing material that includes said fluorescent material and that is disposed around said LED device, comprising the steps of:

forming light scattering sections on a surface of said sealing material that scatter a portion of light emitted from said LED device for adjusting chromaticity of said LED light source;

measuring chromaticity of said LED light source; and determining positions of the light scattering sections according to chromaticity correction amount for adjusting the measured chromaticity to the desired chromaticity, wherein the light scattering sections are formed on the surface of said sealing material that scatter a portion of light emitted from said LED device according to said determined positions.

12. The chromaticity adjustment method according to claim 11, wherein said light scattering sections include projections and depressions formed as dots.

13. The chromaticity adjustment method according to claim 11, wherein said light scattering sections include projections and depressions formed in the form of lines.

14. The chromaticity adjustment method according to claim 11, wherein said light scattering sections include projections and depressions formed in the form of planes.

15. A chromaticity adjustment method in an LED light source having an LED device, a fluorescent material that absorbs and wavelength-converts a portion of light emitted from said LED device to emit light from itself, and a sealing material that includes said fluorescent material and that is disposed around said LED device, comprising the step of:

forming light scattering sections on a surface of said sealing material that scatter a portion of light emitted from said LED device for adjusting chromaticity of said LED light source;

wherein said LED device emits blue light and said fluorescent material absorbs the blue light and emits yellow light so that said LED light source emits pseudo white light, wherein said light scattering sections are formed in a region within a critical angle so as to adjust chromaticity of the pseudo white light emitted from said LED light source toward the yellow side, or formed outside said region within a critical angle so as to adjust chromaticity of the psuedo while light emitted from said LED light source toward the blue side.

* * * * *